US008183932B2

(12) United States Patent
Zolfaghari

(10) Patent No.: US 8,183,932 B2
(45) Date of Patent: *May 22, 2012

(54) METHOD AND SYSTEM FOR PROCESSING SIGNALS VIA AN INTEGRATED LOW NOISE AMPLIFIER HAVING CONFIGURABLE INPUT SIGNALING MODE

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/718,570

(22) Filed: Mar. 5, 2010

(65) Prior Publication Data
US 2010/0182089 A1    Jul. 22, 2010

Related U.S. Application Data

(63) Continuation of application No. 12/192,976, filed on Aug. 15, 2008, now Pat. No. 7,705,683.

(60) Provisional application No. 61/073,940, filed on Jun. 19, 2008.

(51) Int. Cl.
*H03F 3/04* (2006.01)

(52) U.S. Cl. ........................................ 330/301; 330/117

(58) Field of Classification Search ............... 330/301, 330/117, 252
See application file for complete search history.

(56) References Cited

U.S. PATENT DOCUMENTS

| | | | |
|---|---|---|---|
| 4,710,724 A * | 12/1987 | Connell et al. | 330/9 |
| 4,885,550 A | 12/1989 | Ferrer | |
| 5,847,600 A * | 12/1998 | Brooks et al. | 330/9 |
| 6,326,846 B1 * | 12/2001 | Brandt | 330/253 |
| 6,400,224 B2 * | 6/2002 | Gharpurey | 330/252 |
| 6,441,688 B1 | 8/2002 | Lau et al. | |
| 6,566,961 B2 | 5/2003 | Dasgupta et al. | |
| 6,606,002 B1 * | 8/2003 | Vice et al. | 330/301 |
| 6,819,182 B2 | 11/2004 | Sibrai | |
| 6,856,197 B1 | 2/2005 | Humphrey | |
| 6,897,720 B2 * | 5/2005 | Fujimoto | 330/9 |
| 6,922,108 B2 * | 7/2005 | Lin | 330/301 |
| 6,982,601 B2 * | 1/2006 | Sibrai | 330/288 |
| 7,205,844 B2 * | 4/2007 | Su et al. | 330/301 |
| 7,224,231 B2 * | 5/2007 | Wu | 330/301 |
| 7,525,383 B2 * | 4/2009 | Kobayashi et al. | 330/261 |
| 7,554,389 B2 * | 6/2009 | Tsuchi et al. | 330/9 |
| 7,639,073 B2 * | 12/2009 | Deng et al. | 330/9 |
| 7,688,146 B2 * | 3/2010 | Kao et al. | 330/301 |
| 7,741,908 B2 * | 6/2010 | Furuta | 330/253 |
| 2005/0218976 A1 * | 10/2005 | Haraguchi et al. | 330/9 |
| 2007/0154022 A1 * | 7/2007 | Iketani et al. | 381/66 |

* cited by examiner

*Primary Examiner* — Henry K Choe
(74) *Attorney, Agent, or Firm* — Thomas, Kayden, Horstemeyer & Risley, LLP

(57) ABSTRACT

Aspects of a method and system for processing signals via an integrated low noise amplifier having a configurable input signaling mode are provided. In this regard, one or more circuits comprising an integrated amplifier may be configurable such that, in a first configuration, the one or more circuits are operable to handle a differential input signal, and, in a second mode of operation, the one or more circuits are operable to handle a single-ended input signal. The one or more circuits may output a differential signal when handling a differential input signal and when handling a single-ended input signal. In some instances, whether the one or more circuits are operable to handle a differential input signal or a single-ended input signal may determined by an inductance of a bond wire coupling the integrated amplifier to an integrated circuit package.

22 Claims, 5 Drawing Sheets

METHOD AND SYSTEM FOR PROCESSING SIGNALS VIA AN INTEGRATED LOW NOISE AMPLIFIER HAVING CONFIGURABLE INPUT SIGNALING MODE

CROSS-REFERENCE TO RELATED APPLICATIONS/INCORPORATION BY REFERENCE

This application is a continuation of U.S. patent application Ser. No. 12/192,976 filed on Aug. 18, 2008, which claimed priority to and benefit from U.S. Provisional Patent Application Ser. No. 61/073,940 filed on Jun. 19, 2008.

The above stated patent application is hereby incorporated herein by reference in its entirety.

FIELD OF THE INVENTION

Certain embodiments of the invention relate to signal processing. More specifically, certain embodiments of the invention relate to a method and system for processing signals via an integrated low noise amplifier having a configurable input signaling mode.

BACKGROUND OF THE INVENTION

As the number of wireless devices and wireless standards continue to grow, wireless communications are increasingly being relied upon to exchange information. For example, Bluetooth, Wi-Fi, cellular communications (e.g., GSM), and global navigation satellite systems (GNSS) are just a few examples of well established wireless communications commonly utilized in today's technology driven societies.

Accordingly, as the number of wireless communication devices increases, there is increasing demand to make the wireless communication devices smaller, more powerful, and less expensive.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for processing signals via an integrated low noise amplifier having a configurable input signaling mode, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for processing signals via an integrated low noise amplifier having a configurable input signaling mode. In this regard, an integrated LNA may be configurable to enable amplification of unbalanced signals or balanced signals. For an unbalanced input signal, a first input terminal of the LNA may be communicatively coupled to ground via an inductance and a bias point of the LNA may be communicatively coupled to a first bias voltage. For a balanced input signal, the first input terminal of the LNA may be communicatively coupled to the balanced signal and the bias point may be communicatively coupled to a second bias voltage. The bias voltage may be selected to be ground or a non-zero voltage. In various embodiments of the invention, the inductance may be the inductance of a bond wire which may communicatively couple the integrated LNA to an IC package or the inductance may be fabricated on a common substrate with the LNA. The LNA may comprise a center-tapped differential inductor which may be coupled to an output terminal of the LNA and may enable the LNA to output differential signals regardless of the input signaling mode. In various embodiments of the invention, an RF choke may be communicatively coupled between each input terminal of the LNA and ground. In some embodiments of the invention, signals may be coupled to the LNA via a balun having a center tap communicatively coupled to ground. In various embodiments of the invention, the LNA may be utilized to amplify GPS signals.

Figure 1:
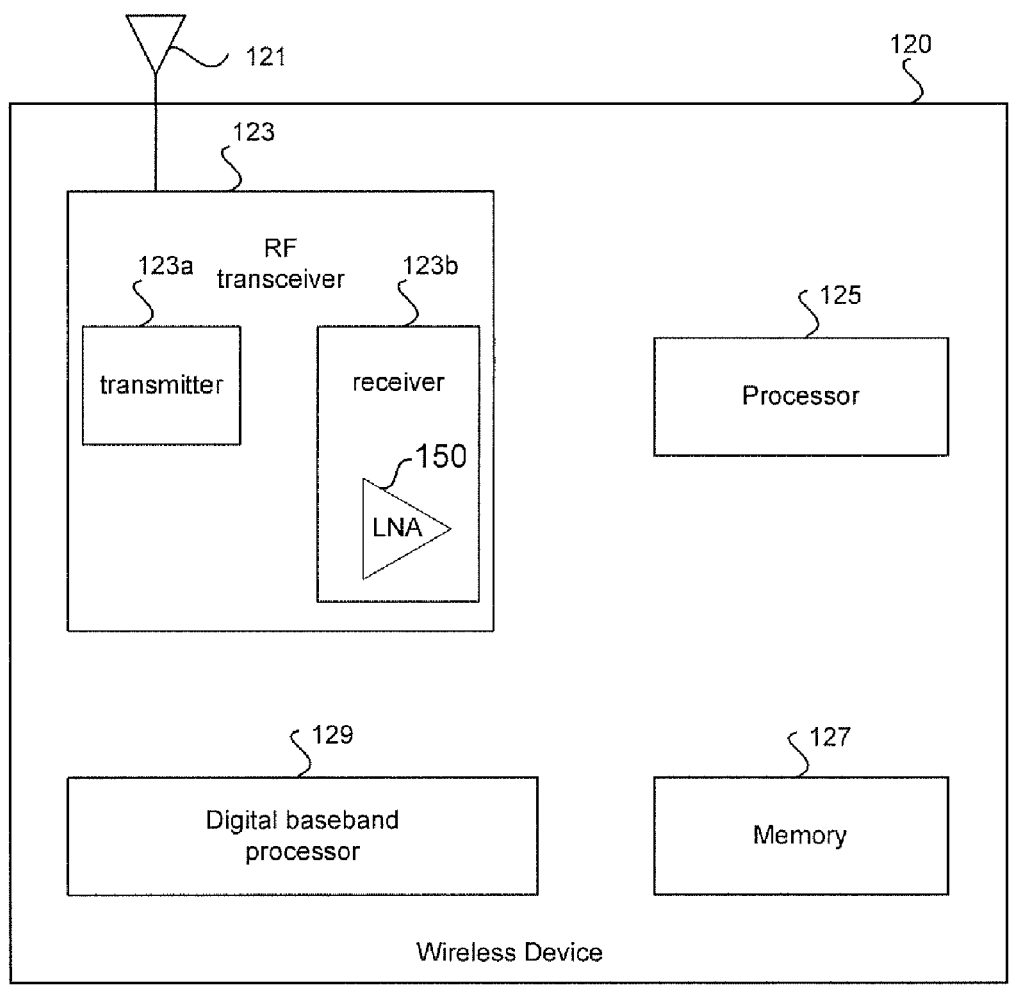
FIG. 1 is a block diagram illustrating an exemplary wireless device, in accordance with an embodiment of the invention.

FIG. 1 is a block diagram illustrating an exemplary wireless device, in accordance with an embodiment of the invention. Referring to FIG. 1, there is shown a wireless device 120 that may comprise an RF transceiver 123, a digital baseband processor 129, a processor 125, and a memory 127. The transceiver 123 may comprise a receiver 123a and a transmitter 123b. An antenna 121 may be communicatively coupled to the RF transceiver 123. The wireless device 120 may be operated in a system, such as a cellular network and/or a global navigation satellite system (GNSS), for example.

The antenna 121 may enable reception and/or transmission of RF signals. In an exemplary embodiment of the invention, the antenna 121 may be suited for receiving GPS signals.

The RF receiver 123a may comprise suitable logic, circuitry, and/or code that may enable processing of received RF signals. The RF receiver 123a may enable receiving RF signals in a plurality of frequency bands. For example, the RF receiver 123a may enable receiving signals in frequency bands between 1.1 GHZ and 1.6 GHz utilized by the global positioning system (GPS). The receiver 123a may be enabled to receive, filter, amplify, down-convert, and/or perform analog to digital conversion. In this regard, the RF receiver 123a may comprise a low noise amplifier (LNA) 150 for amplifying signals received via the antenna 121. Moreover, aspects of the invention may enable configuring the LNA 150 to receive either single-ended (unbalanced) signals or differential signals (balanced). In various embodiments of the invention, the wireless device 120 may comprise a plurality of the receivers 123a and may thus support multiple frequency bands and or simultaneous reception of signals in the same frequency band.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. In this regard, the baseband processor 129 may provide one or more control signals for configuring the LNA 150 via one or more switching elements. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of RE signals in a plurality of frequency bands. For example, the RF transmitter 123b may enable transmitting signals in cellular frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless device 120 may comprise more than one RF transmitter 123b, wherein each of the RF transmitters 123b may be a single-band or a multi-band transmitter. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless device 120. The processor 125 may be utilized to control at least a portion of the RE receiver 123a, the RF transmitter 123b, the digital baseband processor 129, and/or the memory 127. In this regard, the processor 125 may generate at least one signal for controlling operations within the wireless device 120. In this regard, the baseband processor 129 may provide one or more control signals for configuring the LNA 150 via one or more switching elements. The processor 125 may also enable execution of applications that may be utilized by the wireless device 120. For example, the processor 125 may execute applications that may enable displaying and/or interacting with content received via cellular transmission signals in the wireless device 120.

The memory 127 may comprise suitable logic, circuitry, and/or code that may enable storage of data and/or other information utilized by the wireless device 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless device 120. For example, the memory 127 may comprise information necessary to configure the LNA 150. In this regard, the memory may store control and/or configuration information for configuring the windings ratio of the transformer 112 via one or more switching elements.

In operation, a wireless signal may be received via the antenna 121 and conveyed to the transceiver 123. In instances that the received signal may be conveyed to the LNA 150 utilizing differential signaling, the LNA 150 may be configured for handling a differential input. Alternatively, in instances that the received signal may be conveyed to the LNA 150 utilizing single-ended signaling, the LNA 150 may be configured for handling a single-ended input.

Figure 2A:
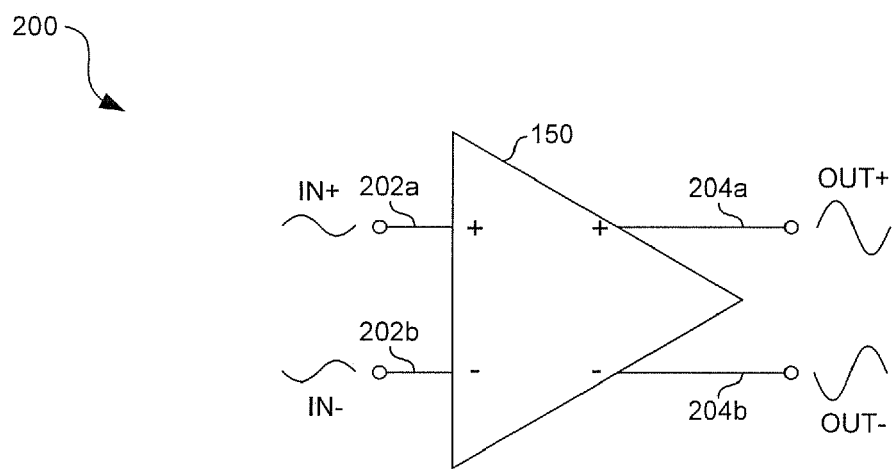
FIG. 2A illustrates a low noise amplifier (LNA) having configurable input signaling mode, in accordance with an embodiment of the invention.
Figure 2A:
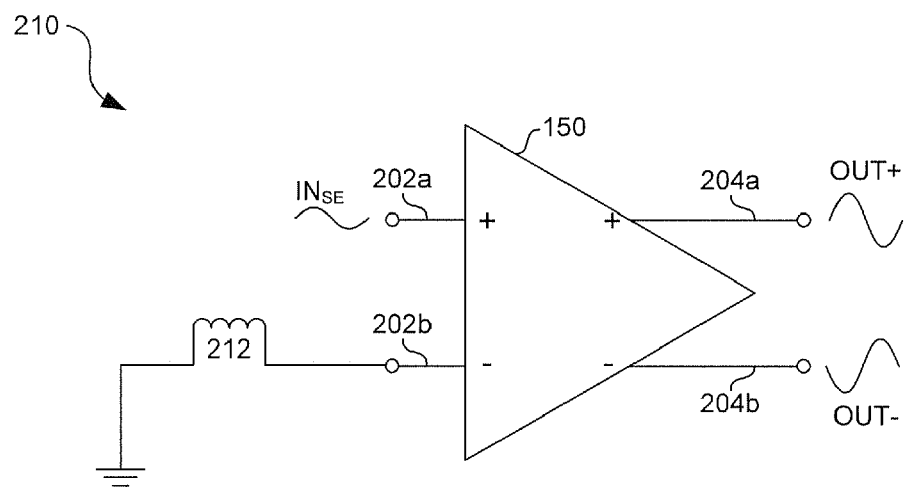

FIG. 2A illustrates a LNA having configurable input signaling mode, in accordance with an embodiment of the invention. Referring to FIG. 2A, there is shown exemplary configurations 200 and 210, for differential and single-ended input signals, respectively, of an LNA 150. The LNA 150 may comprise input terminals 202a and 202b, gain stage 208, and output terminals 204a and 204b. The configuration 210 may additionally comprise an inductor 212.

In configuration 200, a pair of differential signals IN+ and IN− may be communicatively coupled to inputs terminals 202a and 202b, respectively, of the LNA 150. In configuration 210, a single-ended signal $IN_{SE}$ may be communicatively coupled to input terminal 202a of the LNA 150 and the input terminal 202b may be communicatively coupled to GND via the inductor 212.

In various exemplary embodiments of the invention, the terminals 202a and 202b may comprise bond pads which may enable communicatively coupling off-chip components to the LNA 150. Also, the inductor 212 may be fabricated on the same substrate as the rest of the LNA 150, the inductor 212 may be the inductance of a bond wire which communicatively couples the LNA 150 to an IC package, or the inductor 212 may be "off-chip" and may be communicatively coupled to the LNA 150 via one or more bond wires, such as is described below with respect to FIG. 2B.

For differential operation, as depicted in configuration 200, the LNA 150 may amplify the differential signals IN+ and IN− communicatively coupled to the inputs 202a and 202b and output a differential representation of the amplified signal, signals OUT+ and OUT−, via the outputs 210a and 210b. For single-ended operation, as depicted in configuration 210, the LNA 150 may amplify a single-ended signal communicatively coupled to the input 202a and output a differential representation of the amplified signal, signals OUT+ and OUT−, via the outputs 210a and 210b. In this regard, the LNA 150 may be enabled to output a balanced signal for both balanced and unbalanced input signals.

Figure 2B:
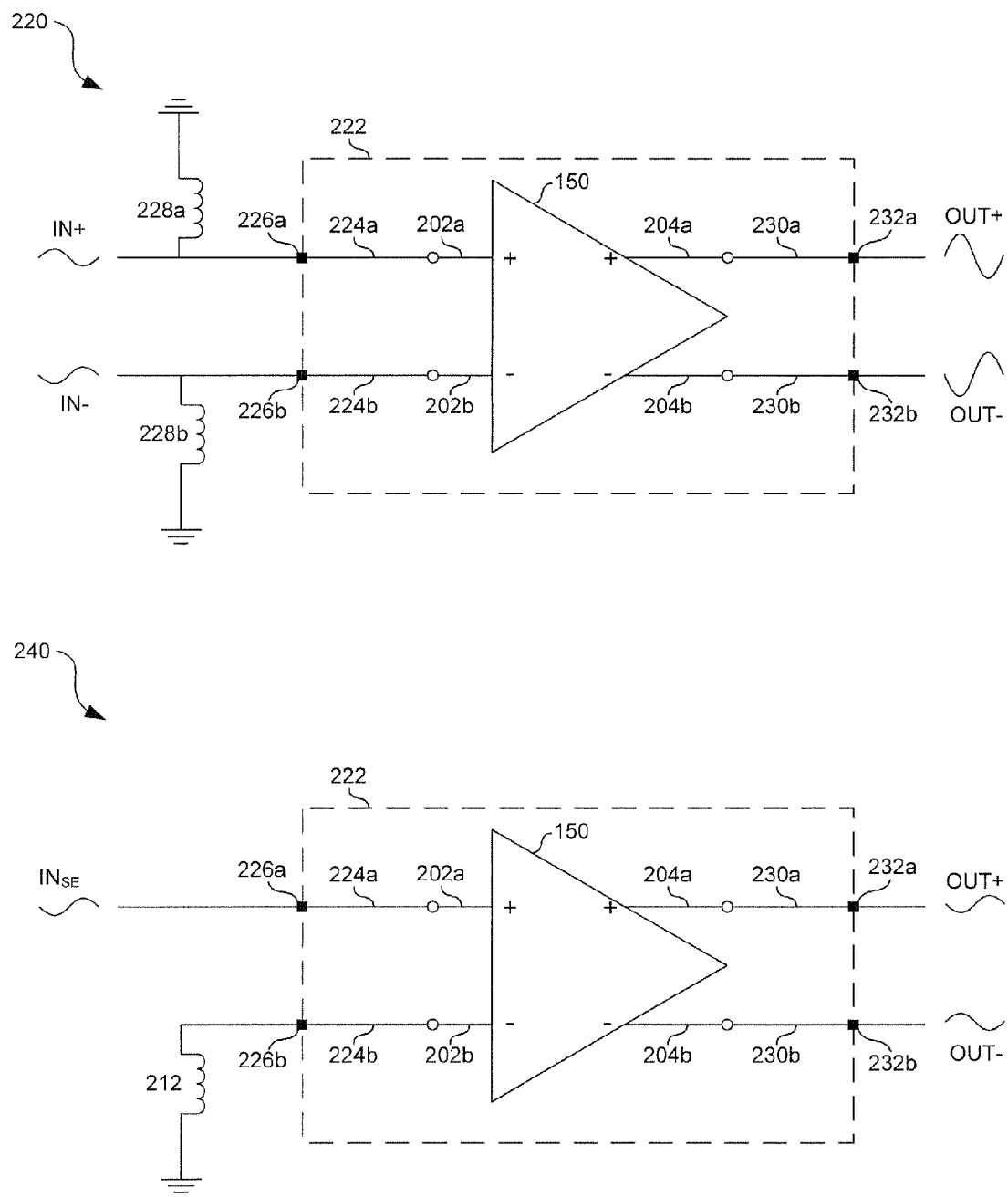
FIG. 2B illustrates an exemplary packaged integrated circuit comprising an LNA having a configurable input signaling mode, in accordance with an embodiment of the invention.

FIG. 2B illustrates an exemplary packaged integrated circuit comprising an LNA having configurable input signaling mode, in accordance with an embodiment of the invention. Referring to FIG. 2B, there is shown exemplary configurations 220 and 240, for differential and single-ended input signals, respectively, of an LNA 150.

In both configurations 220 and 230, the LNA 150 may be bonded to an integrated circuit package 222. In this regard, the input terminal 202a may be bonded to a package pin 226a via a bond wire 224a and the input terminal 202b may be bonded to a package pin 226b via a bond wire 224b. Similarly, the output terminal 204a may be bonded to a package pin 232a via a bond wire 230a and the input terminal 204b may be bonded to a package pin 232b via a bond wire 230b. In various embodiments of the invention, the inductor 212 may be realized utilizing the bond wire 224b. In this regard, the length of the bond wire 224b may be determined so as to achieve the desired inductance of inductor 212. In various embodiments of the invention, the inductor 212 may be realized on a common substrate with the LNA 150. In instances that the inductance may be on-chip or in the IC package 222, the input signal IN− may be communicatively coupled to the input terminal 202b via the inductance 212.

For differential operation, as depicted in configuration 220, input signals IN+ and IN− may be communicatively coupled to the pins 226a and 226b and the amplified differential signal pair, OUT+ and OUT−, may be output via pins 232a and 232b. In various exemplary embodiments of the invention, an RF choke 228 may be communicatively coupled to signals input to the LNA 150. For example, the RF chokes 228a and 228b may be operable to remove a DC bias from signals IN+ and IN−, respectively, and may prevent the input signals from driving one or more transistors of the LNA 150 into saturation. In other exemplary embodiments of the invention, the input signals IN+ and IN− may be communicatively coupled to the LNA 150 via a balun and a tap of the secondary winding of the balun may be grounded. In this manner, the balun may serve to remove a DC bias from signals IN+ and IN− and may prevent the input signals from driving one or more transistors of the LNA 150 into saturation.

For single-ended operation, as depicted in configuration 230, input signal $IN_{SE}$ may be communicatively coupled to pin 226a, the pin 226b may be communicatively coupled to ground via the inductor 212, and the amplified signal pair, OUT+ and OUT−, may be output via pins 232a and 232b. In this regard, the RF chokes 228a and 228b utilized for differential operation, as depicted in configuration 220, may be removed. Furthermore, the RF choke 228b may be replaced by an inductor 212. Accordingly, a system designer may couple pin 226b to an RF choke 228b for differential input signals and to a source degeneration inductor 212 for single-ended input signals.

Figure 3:
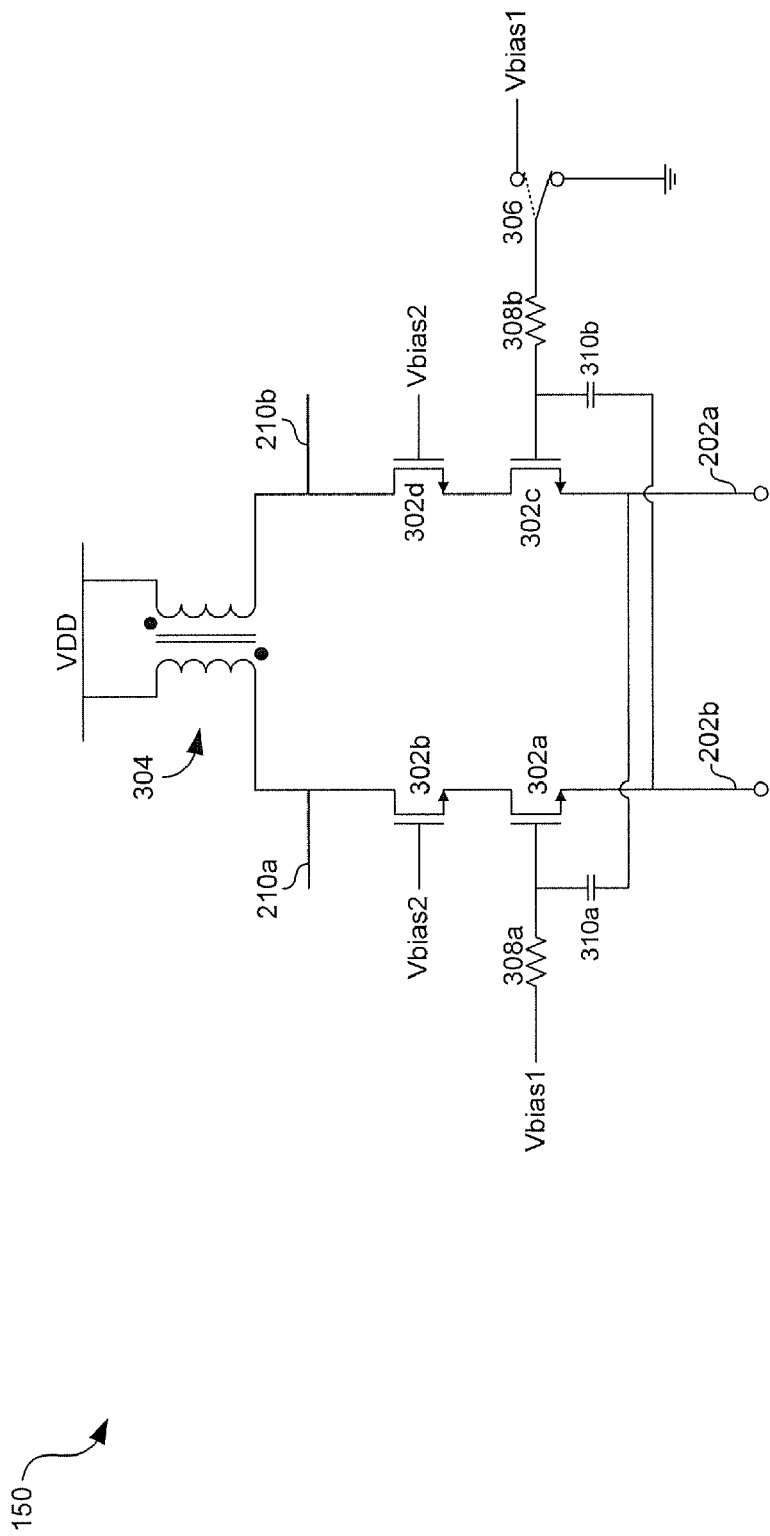
FIG. 3 is a diagram of an integrated LNA having configurable input signaling mode, in accordance with an embodiment of the invention.

FIG. 3 is a diagram of an integrated LNA having configurable input signaling mode, in accordance with an embodiment of the invention. Referring to FIG. 3, the LNA 150 may comprise four transistor 302a, 302b, 302c, 302d, a center-tapped differential inductor 304, switching element 306, biasing resistors 308a and 308b, and DC blocking capacitors 310a and 310b.

In various exemplary embodiments of the invention, the switching element 306 may comprise one or more transistors, transmission gates, and/or micro-electro-mechanical (MEMS) switches.

A first terminal of the inductor 304 may be communicatively coupled to the output 210a. A second terminal of the inductor 304 may be communicatively coupled to the output 210b, and a center-tap of the inductor 304 may be communicatively coupled to a bias voltage, VDD. The output 210a may also be communicatively coupled to the drain of the transistor 302b. The output 210b may also be communicatively coupled to the drain of the transistor 302d. The gate of the transistor 302b may be communicatively coupled to a bias voltage, Vbias2. The gate of the transistor 302d may be communicatively coupled to a bias voltage, Vbias2.

The source of the transistor 302b may be communicatively coupled the drain of the transistor 302a. The source of the transistor 302d may be communicatively coupled the drain of the transistor 302c. The gate of the transistor 302a may be communicatively coupled to a first terminal of the resistor 308a and to a first terminal of the capacitor 310a. The gate of the transistor 302c may be communicatively coupled to a first terminal of the resistor 308b and to a first terminal of the capacitor 310b. The second terminal of the resistor 308a may be communicatively coupled to a bias voltage, Vbias1. The second terminal of the resistor 308b may be communicatively coupled to a pole of switch 306. A first throw of the switch 306 may be communicatively coupled to bias voltage, Vbias1. A second throw of the switch 306 may be communicatively coupled to ground.

The source of the transistor 302a may correspond to the input terminal 202b and may be communicatively coupled to a second terminal of the capacitor 310b. The source of the transistor 302c may correspond to the input terminal 202a and may be communicatively coupled to a second terminal of the capacitor 310a.

In operation, the switching element 306 may be configured based on whether a single-ended signal or a differential signal may be amplified by the LNA 150. For amplification of a single-ended signal, the single-ended signal may be communicatively coupled to input 202a, the switching element 306 may be configured so as to communicatively couple the second terminal of the resistor 308b to ground, and the input terminal 202b may be communicatively coupled to ground via an inductor (not shown in FIG. 3). For amplification of a differential signal, the positive differential signal may be communicatively coupled to the input 202a, the negative differential signal may be communicatively coupled to the input 202b, and the switching element 306 may be configured so as to communicatively couple the second terminal of the resistor 308b to Vbias1.

Figure 4:
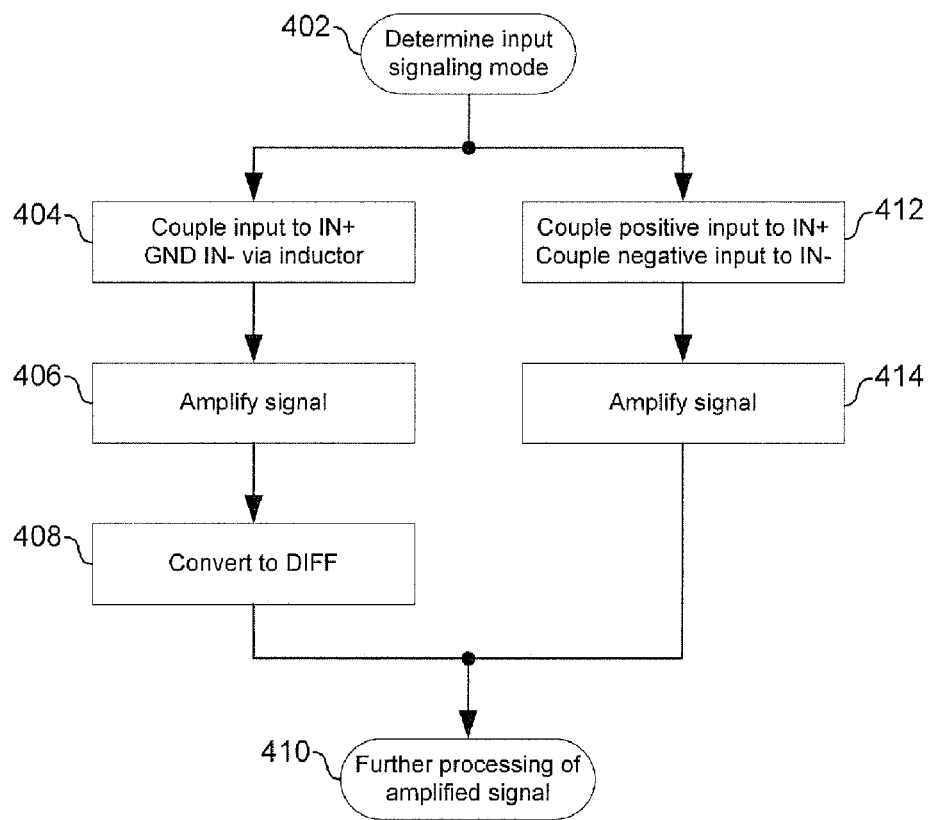
FIG. 4 illustrates exemplary steps for processing signals with a LNA having configurable input signaling mode.

FIG. 4 illustrates exemplary steps for processing signals with a LNA having configurable input signaling mode. Referring to FIG. 4, the exemplary steps may begin in step 402 with the device 120 determining whether single-ended or differential signals are to be processed. In instances where it may be desirable to amplify single-ended signals, the exemplary steps may advance to step 404.

In step 404, the LNA 150 in the device 120 may be configured for amplifying single-ended signals. In this regard, the negative terminal 202b of the LNA 150 may be communicatively coupled to ground via an inductor 212, and the single-ended signal to be amplified, $IN_{SE}$, may be communicatively coupled to the positive terminal 202a of the LNA 150. Subsequent to step 404, the exemplary steps may advance to step 406.

In step 406, the single-ended signal may be amplified by the LNA 150. In this regard, the gain may be determined by, for example, dimensions of one or more FETs 302 within the LNA 150 and/or one or more bias voltages and/or current applied to the LNA 150. Subsequent to step 406, the exemplary steps may advance to step 408.

In step 408, the output of the LNA 150 may be converted to a differential signal. For example, center-tapped differential inductor 304 may couple the amplified signal at the output 210b to the output 210a. In this regard, the polarity of the signal at 210a may be opposite the signal at output 210b, thus resulting in a differential signal. Subsequent to step 408, the exemplary steps may advance to step 410.

In step 410, the output of the LNA may be further processed. For example, the signal may be down-converted, demodulated, decoded, and/or converted to a digital representation.

Returning to step 402, in instances where it may be desirable to amplify differential signals, the exemplary steps may advance to step 412. In step 412, the LNA 150 may be configured for amplifying differential signals. In this regard, a first signal, IN+, of a differential pair may be communicatively coupled to the positive input terminal 202a of the LNA 150 and a second signal, IN−, of a differential pair may be communicatively coupled to the negative input terminal 202b of the LNA 150. Subsequent to step 412, the exemplary steps may advance to step 414.

In step 414, the differential signal may be amplified by the gain stage 208 of the LNA 150. In this regard, the gain may be determined by, for example, dimensions of one or more FETs 302 within the LNA 150 and/or one or more bias voltages and/or current applied to the LNA 150. Subsequent to step 414, the exemplary steps may advance to the previously described step 410.

Exemplary aspects of a method and system for processing signals via an integrated low noise amplifier having configurable input signaling mode are provided. For an unbalanced input signal, $IN_{SE}$, the input terminal 202b of the LNA 150 may be communicatively coupled to ground via an inductance 212 and a bias point of the LNA 150 may be communicatively coupled to a first bias voltage. For a balanced input signal, the input terminal 202b of the LNA 150 may be communicatively coupled to the balanced signal, IN−, and the bias point may be communicatively coupled to a second bias voltage. The first bias voltage may be ground and the second bias voltage may be a non-zero voltage. In various embodiments of the invention, the inductance 212 may be the inductance of the bond wire 224b which may communicatively couple the integrated LNA 150 to an IC package 222 or the inductance 212 may be fabricated on a common substrate with the LNA 150. The LNA 150 may comprise a center-tapped differential inductor 304 which may be coupled to an output terminal 210a and/or 210b of the LNA 150 and may enable the LNA 150 to output differential signals regardless of the input signaling mode. In various embodiments of the invention, an RF choke 228 may be communicatively coupled between each input terminal 202 of the LNA 150 and ground. In some embodiments of the invention, signals may be coupled to the LNA via a balun having a center tap communicatively coupled to ground. In various embodiments of the invention, the LNA may be utilized to amplify GNSS signals such as GPS signals.

Another embodiment of the invention may provide a machine-readable storage, having stored thereon, a computer program having at least one code section executable by a machine, thereby causing the machine to perform the steps as described herein for processing signals via an integrated low noise amplifier having configurable input signaling mode.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for signal processing, the system comprising:
one or more circuits comprising an integrated low noise amplifier, said one or more circuits being configurable during operation such that:
in a first configuration, said one or more circuits are operable to amplify a differential radio-frequency input signal;
in a second configuration, said one or more circuits are operable to amplify a single-ended radio-frequency input signal; and
wherein an inductance between an input of said integrated low noise amplifier and a reference point comprises a first inductance for said first configuration and comprises a second inductance for said second configuration.

2. The system according to claim 1, wherein said one or more circuits output a differential signal when processing said differential radio-frequency input signal and when processing said single-ended radio-frequency input signal.

3. The system according to claim 1, wherein a voltage applied to a bias point of said one or more circuits comprises a first voltage for said first configuration and comprises a second voltage for said second configuration.

4. The system according to claim 1, wherein said inductance comprises the inductance of a bond wire which communicatively couples said integrated low noise amplifier to an integrated circuit package.

5. The system according to claim 1, wherein said inductance is fabricated on a common substrate with said integrated low noise amplifier.

6. The system according to claim 1, wherein a first bias voltage and a second bias voltage are available to said one or more circuits, and said first bias voltage is different than said second bias voltage.

7. The system according to claim 1, wherein said circuits comprise a center-tapped differential inductor that is coupled to an output terminal of said integrated low-noise amplifier.

8. A system for signal processing, the system comprising:
one or more circuits comprising an integrated low noise amplifier, said one or more circuits being configurable during operation such that:
in a first configuration, said one or more circuits are operable to amplify a differential radio-frequency input signal;
in a second configuration, said one or more circuits are operable to amplify a single-ended radio-frequency input signal;
wherein a first bias voltage and a second bias voltage are available to said one or more circuits, and said first bias voltage is different than said second bias voltage; and
wherein, for said first configuration, a first input terminal of said integrated low noise amplifier is communicatively coupled to a reference voltage via an inductance and a bias point of said integrated low noise amplifier is communicatively coupled to said first bias voltage.

9. The system according to claim 8, wherein, for said second configuration, a first input terminal and a second input terminal of said integrated low noise amplifier are communicatively coupled to said differential radio-frequency input signal and a bias point of said integrated low noise amplifier is communicatively coupled to said second bias voltage.

10. A system for signal processing, the system comprising:
one or more circuits comprising an integrated amplifier, said one or more circuits being configurable during operation to amplify a single-ended or differential input signal, wherein:
for amplifying said single-ended input signal, a first input terminal of said integrated amplifier is communicatively coupled to a reference voltage via an inductance and a bias point of said integrated amplifier is communicatively coupled to a first bias voltage;
wherein, for amplifying said differential input signal, said first input terminal of said integrated amplifier is communicatively coupled to said differential input signal and a bias point is communicatively coupled to a second bias voltage; and
wherein said reference voltage is zero volts DC, said first bias voltage is zero volts DC, and said second bias voltage is a non-zero voltage.

11. The system according to claim 10, wherein said one or more circuits output a differential signal when amplifying said differential input signal and when amplifying said single-ended input signal.

12. A system for signal processing, the system comprising:
one or more circuits comprising an integrated amplifier, said one or more circuits being configurable during operation to switch between a first configuration in which said one or more circuits amplify a differential input signal and a second configuration in which said one or more circuits amplify a single-ended input signal, wherein:
for amplifying said differential input signal, a first input terminal and a second input terminal of said integrated amplifier are communicatively coupled to said differential input signal and a bias point is communicatively coupled to a first bias voltage; and
wherein, for amplifying said single-ended input signal, a first input terminal of said integrated amplifier is communicatively coupled to ground via an inductance and a bias point of said integrated amplifier is communicatively coupled to a second bias voltage.

13. The system according to claim 12, wherein said reference voltage is zero volts DC, said first bias voltage is zero volts DC, and said second bias voltage is a non-zero DC voltage.

14. A system for signal processing, the system comprising:
one or more circuits comprising an integrated amplifier, said one or more circuits being configurable such that:
in a first configuration, said one or more circuits are operable to amplify a differential input signal, and a voltage applied to a bias point of said one or more circuits comprises a first voltage;
in a second configuration, said one or more circuits are operable to amplify a single-ended input signal, and a voltage applied to said bias point of said one or more circuits comprises a second voltage; and
wherein an inductance between an input of said integrated amplifier and a reference point comprises a first inductance for said first configuration and comprises a second inductance for said second configuration.

15. The system according to claim 14, wherein said inductance comprises the inductance of a bond wire which communicatively couples said integrated amplifier to an integrated circuit package.

16. The system according to claim 14, wherein said inductance is fabricated on a common substrate with said integrated amplifier.

17. The system according to claim 14, wherein a first bias voltage and a second bias voltage are available to said one or more circuits, and said first bias voltage is different than said second bias voltage.

18. The system according to claim 17, wherein, for said first configuration, a first input terminal of said integrated amplifier is communicatively coupled to a reference voltage via an inductance and a bias point of said integrated amplifier is communicatively coupled to said first bias voltage.

19. The system according to claim 17, wherein, for said second configuration, a first input terminal and a second input terminal of said integrated amplifier are communicatively coupled to said differential input signal and a bias point of said integrated amplifier is communicatively coupled to said second bias voltage.

20. The system according to claim 14, wherein said circuits comprise a center-tapped differential inductor that is coupled to an output terminal of said integrated amplifier.

21. A system for signal processing, the system comprising:
one or more circuits comprising an integrated amplifier, said one or more circuits being configurable to handle a single-ended or differential input signal, wherein:
for handling said single-ended input signal, a first input terminal of said integrated amplifier is communicatively coupled to a reference voltage via an inductance and a bias point of said integrated amplifier is communicatively coupled to a first bias voltage;
for handling said differential input signal, said first input terminal of said integrated amplifier is communicatively coupled to said differential input signal and a bias point is communicatively coupled to a second bias voltage; and
wherein said reference voltage is zero volts DC, said first bias voltage is zero volts DC, and said second bias voltage is a non-zero voltage.

22. The system according to claim 21, wherein said one or more circuits output a differential signal when handling said differential input signal and when handling said single-ended input signal.

* * * * *

UNITED STATES PATENT AND TRADEMARK OFFICE
CERTIFICATE OF CORRECTION

PATENT NO. : 8,183,932 B2  Page 1 of 1
APPLICATION NO. : 12/718570
DATED : May 22, 2012
INVENTOR(S) : Zolfaghari It is certified that error appears in the above-identified patent and that said Letters Patent is hereby corrected as shown below:

Column 3, line 23, please replace "RE signals" with --RF signals--.

Column 3, line 43, please replace "RE receiver" with --RF receiver--.

Signed and Sealed this
Seventeenth Day of July, 2012

David J. Kappos
*Director of the United States Patent and Trademark Office*